US009359223B2

(12) United States Patent
Narayanan et al.

(10) Patent No.: US 9,359,223 B2
(45) Date of Patent: Jun. 7, 2016

(54) METHOD FOR PRODUCING THIN FILM ELECTRODES

(75) Inventors: Manoj Narayanan, Woodridge, IL (US); Beihai Ma, Naperville, IL (US); Uthamalingam Balachandran, Willowbrook, IL (US); Stephen Dorris, La Grange Park, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 269 days.

(21) Appl. No.: 13/237,487

(22) Filed: Sep. 20, 2011

(65) Prior Publication Data
US 2013/0071670 A1 Mar. 21, 2013

(51) Int. Cl.
*B05D 5/12* (2006.01)
*C01G 55/00* (2006.01)
*H01L 49/02* (2006.01)

(52) U.S. Cl.
CPC ............ *C01G 55/00* (2013.01); *C01P 2004/03* (2013.01); *C01P 2006/32* (2013.01); *H01L 28/65* (2013.01); *Y10T 428/31678* (2015.04)

(58) Field of Classification Search
USPC ...................................................... 427/126.5
See application file for complete search history.

(56) References Cited

U.S. PATENT DOCUMENTS

2012/0063058 A1* 3/2012 Kim et al. .................... 361/502

OTHER PUBLICATIONS

Suzuki et al. "Chemical solution depsotion for conductive SrRuO3 thin film on Si substrate" (2004).*
Mercurio et al. (Fabrication of SrRuO3 powders and thin films by metalorganic decomposition, Aug. 2000).*
Narayanan et al. (Sol-Gel Synthesis of High-Quality SrRuO3 Thin-Film Electrodes Suppressing the Formation of Detrimental RuO2 and the Dielectric properties of Integrated Lead Lanthanum Zirconate Titanate Filmes, Dec. 2010).*
Beihai Ma, et al., Chemical Solution—Deposition of Ferroelectric Lead Lanthanum Zirconate Titanate Films on Base-Metal Foils, Journal Electroceram, (2009), 22, pp. 383-389.
Manoj Narayanan, et al., Sol-Gel Synthesis of High-Waulity SrRuO3 Thin Film Electrodes Suppressing the Formation of Detrimental RuO2 and the Dielectric Properties of Integrated Lead Lanthanun Zironate Titanate Films, Chem. Met., 2011, 23, pp. 106-113.

* cited by examiner

*Primary Examiner* — Austin Murata
(74) *Attorney, Agent, or Firm* — Cherskov Flaynik & Gurda, LLC

(57) ABSTRACT

The invention provides for A method for producing pure phase strontium ruthenium oxide films, the method comprising solubilizing ruthenium-containing and strontium-containing compounds to create a mixture; subjecting the mixture to a first temperature above that necessary for forming $RuO_2$ while simultaneously preventing formation of $RuO_2$; maintaining the first temperature for a time to remove organic compounds from the mixture, thereby forming a substantially dry film; and subjecting the film to a second temperature for time sufficient to crystallize the film. Also provided is pure phase material comprising strontium ruthenium oxide wherein the material contains no $RuO_2$.

12 Claims, 4 Drawing Sheets

METHOD FOR PRODUCING THIN FILM ELECTRODES

CONTRACTUAL ORIGIN OF THE INVENTION

The U.S. Government has rights in this invention pursuant to Contract No. DE-AC02-06CH11357 between the United States Government and UChicago Argonne, LLC, representing Argonne National Laboratory.

BACKGROUND OF THE INVENTION

1. Field of the Invention

The present invention relates to thin electrically conductive films, and more specifically, the present invention relates to a wet-bench method for producing substantially pure electrically conductive films.

2. Background of the Invention

In microelectronics, device performance is strongly related to the microstructure and the electrical resistivity of thin film electrodes.

During the last two decades, strontium ruthenium oxide (SRO) thin film electrodes have received considerable attention because of their high metallic conductivity and high temperature stability (1200 K or 927° C.) in oxidizing or inert atmospheres, making them suitable in numerous technological applications. Moreover, SRO films improve the fatigue and imprint behavior of ferroelectric materials such as barium strontium titanate (BST) and lead lanthanum zirconate titanate (PLZT), due to minimal lattice mismatch between the film and the ferroelectric materials.

Considering various applications of SRO films, extensive efforts have been devoted to depositing device-quality SRO thin films on (100)Si, (100)SrTiO$_3$, (100)LaAlO$_3$, and (100) MgO substrates. These efforts rely on expensive and complicated techniques like RF sputtering, pulsed laser deposition (PLD), dc magnetron sputtering, and metal-organic chemical vapor deposition (MOCVD).

Researchers have used metal-organic decomposition to form SRO powders and films on silicon substrates with different precursors. However, these powders and films included unidentified impurities (secondary phases) and RuO$_2$. Moreover, the fabricated SRO films on silicon substrates are randomly oriented such that the lattice formed by the cations in the films is not aligned with the lattice defining the underlying substrate.

Processes of depositing SRO films on steel substrates are sensitive to pyrolysis and crystallization temperatures. For example, precursor ruthenium nitrosyl nitrate decomposes to unwanted RuO$_2$ phase at temperatures as low as 260° C. And at such low pyrolysis temperatures, not all organics are removed, therefore leading to inhibition of the formation of the metal-oxygen-metal (M-O-M) gel network. Additionally, the undesired RuO$_2$ phase does not change during the final crystallization anneal even at higher temperatures.

Strontium metal and strontium chloride precursors have been used to fabricate SRO films with resistivity of 1100-20000/μΩ-cm. However, chlorine containing precursor compounds are typically detrimental to the electrical properties due to incomplete removal of chlorine after crystallization and the diffusion of residual chlorine into the dielectric layers that are subsequently deposited.

A need exists in the art for a wet-bench process for producing strontium ruthenium oxide films. The process should yield substantially pure phase SRO films. The process should also provide films with electrical resistivities at least as low as 850±50 μΩ/cm for polycrystalline films and at least 300-400 μΩ/cm for oriented films.

SUMMARY OF INVENTION

An object of the invention is to provide a process for producing SRO films that overcomes many of the disadvantages of the prior art.

Another object of the invention is to provide a process for producing electrically conductive films. A feature of the process is that it is conducted substantially entirely in liquid phase. An advantage of the process is that it allows for alignment of the oxide, comprising the cations, with the atomic lattice comprising the foundation substrate supporting the film.

Yet another object of the present invention is to provide a sol gel process to produce conformal coatings having electrical resistivity less than 1130 μΩ/cm which is the typical resistivity value of bulk polycrystalline SRO and films made by state of the art sol gel processes. A feature of the invention is the use of precursors which, during film fabrication, utilize substantially all of the ruthenium cations in constructing a cation lattice. An advantage of the invention is that the subsequent paucity of ruthenium cations during film processing prevents the formation of ruthenium dioxide and/or other unwanted secondary phases.

Still another object of the present invention is to provide an SRO film with resistivities at or below 850±50 μΩ/cm, and preferably between 280 μΩ/cm and 850±50 μΩ/cm. A feature of the invention is that the film comprises strontium and ruthenium cations arranged in a polycrystalline structure that is similar to the lattice structure of the film's underlying substrate. An advantage of the invention is that such lattice alignment or synergy enhances lattice development in the film so as to increase its electrical conductivity and other properties.

Briefly, the invention provides for a method for producing pure phase strontium ruthenium oxide films, the method comprising solubilizing ruthenium-containing and strontium-containing compounds to create a mixture; subjecting the mixture to a first temperature above that necessary for forming RuO$_2$ while simultaneously preventing formation of RuO$_2$; maintaining the first temperature for a time to remove organic compounds from the mixture, thereby forming a substantially dry film; and subjecting the film to a second temperature for time sufficient to crystallize the film.

Also provided is pure phase material comprising strontium ruthenium oxide wherein the material contains no RuO$_2$.

BRIEF DESCRIPTION OF DRAWING

The invention together with the above and other objects and advantages will be best understood from the following detailed description of the preferred embodiment of the invention shown in the accompanying drawings, wherein.

DETAILED DESCRIPTION OF THE INVENTION

Figure 1:
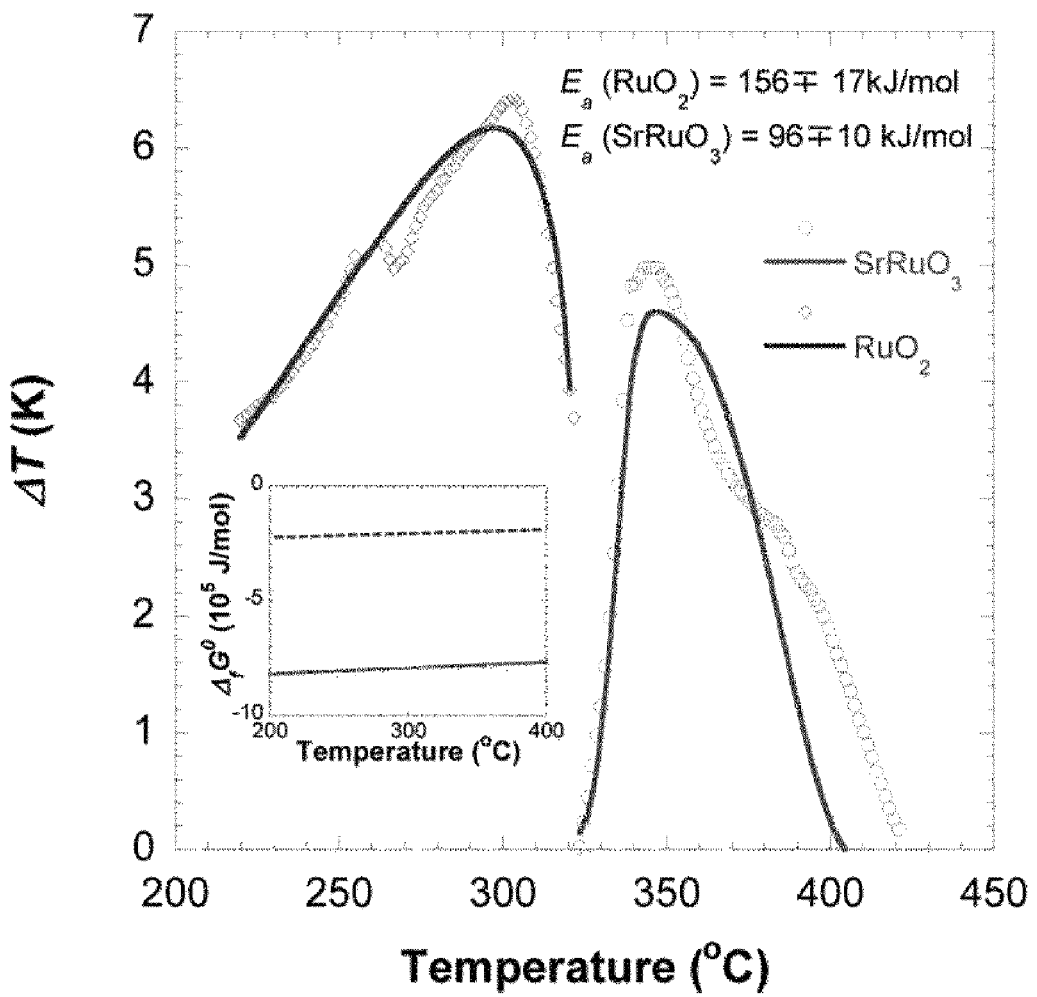
FIG. 1 is a chart comparing the activation energy ($E_{act}$) for the invented sol-gel protocol, in accordance with features of the present invention.

The foregoing summary, as well as the following detailed description of certain embodiments of the present invention, will be better understood when read in conjunction with the appended drawings.

As used herein, an element or step recited in the singular and preceded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

SRO films are ideal as conductive electrodes and/or buffer layers to grow epitaxial ferroelectric thin films in many applications, including dynamic random access memory (DRAM) and ferroelectric random access memory (FeRAM). The room-temperature resistivity of SRO thin film formed by physical vapor deposition techniques is of the order of $10^{-4}$ $\Omega$-cm, which is good enough to be employed as an electrode in several oxide-based devices. At room temperature, SRO perovskite crystallizes in the orthorhombic structure with space group Pbnm and lattice parameters a=5.5730 Å, b=5.5381 Å, and c=7.856 Å. This structure is a slightly distorted pseudocubic perovskite with unit cell parameter $a_c$=3.93 Å, presenting excellent structural compatibility with many perovskite-based ferroelectric oxides.

The inventors have developed solution chemistry incorporating pyrolysis and crystallization conditions to fabricate substantially phase pure SRO thin films. The film production process is nonsintering in nature. The invented process is not conducted in gaseous phase such that the process is substantially entirely liquid phase. This liquid phase sol gel process includes lattice orientation between the forming film and any substrates the film contacts. Further, the lack of elaborate setup or high vacuum involved in state of the art processes, such as gas phase, facilitates inexpensive incorporation of the invented process into existing production lines.

The invented process chemistry prevents the formation of ruthenium dioxide by exploiting the lower energy of activation of SRO films compared to the $E_{act}$ of ruthenium dioxide. As a result, the ruthenium is coupled to strontium cations in a metal-oxygen-metal (M-O-M) paradigm to define a film. Simultaneous with this coupling mechanism, the film is subjected to process heat so as to drive off solvents which were needed to initially solvate the cations. A first heating step, called a pyrolysis step, involves heating a film applied to a support substrate at temperatures that would normally result in the formation of $RuO_2$. However, given the sequestration (i.e., due to the aforementioned lower $E_{act}$ of the invented sol-gel process) of the ruthenium cation, such di-oxide formation does not occur. At the end of this first heating step (where applied temperatures range from 250-500° C.), the film is amorphous in nature. As such, the first step facilitates short range ordering of M-O-M moieties on the support surface.

Figure 3:
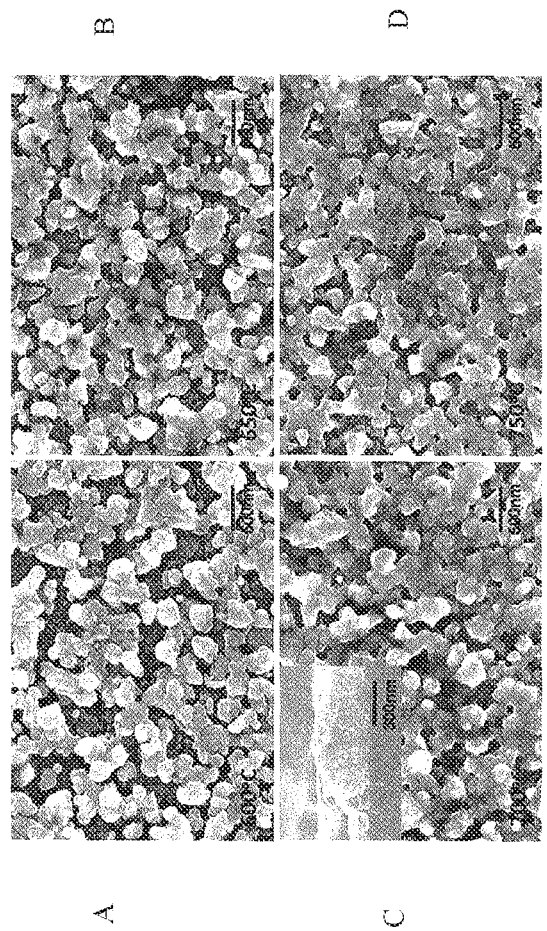
FIGS. 3A-D are scanning electron micrographs showing the topography of SRO films produced at various temperatures, in accordance with features of the present invention.
Figure 4:
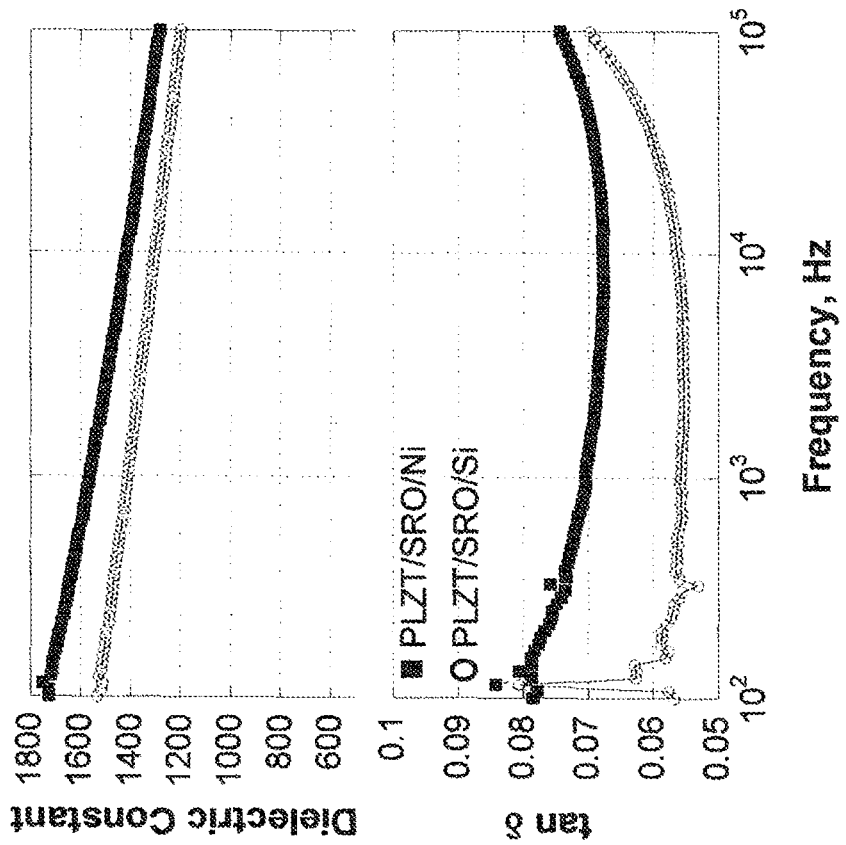
FIG. 4 is a graph showing the dielectric properties of composites incorporating SRO films, in accordance with features of the present invention.

FIG. 1 illustrates how much lower the activated energy for amorphous SRO is compared to $RuO_2$. Specifically, the activation energy of SRO is about 96+/−10 kJ/mol while the activation energy for $RuO_2$ is about 156+/−17 kJ/mol. FIG. 3 depicts the measured and calculated ΔT for ruthenium nitrosyl nitrate in 2-MOE and SRO stock solution. The inset shows the Gibbs energy of formation for $RuO_2$ and $SrRuO_3$ in the same temperature range.

A second heating step, called a crystallization step, subjects the now-dried film to higher heat (e.g. about 500° C. to about 800° C.) to facilitate formation of the desired SRO phase. The density of the film so formed approximates 93-94 percent Aerial Density, which is calculated by imaging processing of SEM micrographs, depicted as FIGS. 3A-D. As such, this second heating step facilitates long range ordering of the M-O-M moieties. Films made at 700-750° C. exhibit less pores (i.e., 93-94 percent dense) compared to films formed at 600-650° C. (86-87 percent dense).

An embodiment of the invention is a sol-gel fabrication process that produces $SrRuO_3$ films which exhibit room-temperature resistivity of about 850±50 μΩ/cm. The invented chemistry is compatible with a myriad of metallic substrates, including but not limited to nickel, silicon, stainless steel, Hastealloy, and combinations thereof. Nonmetallic substrates such as Alumina, $SrTiO_3$(STO), $LaAlO_3$ (LAO), MgO YSZ and combinations thereof also are suitable.

The invention provides a process for generating films without the formation of undesired $RuO_2$ or secondary phases. SRO electrodes provide high metallic conductivity and high temperature stability in oxidizing or inert atmospheres. They also improve the fatigue and failure characteristics of ferroelectric materials such as barium strontium titanate and lead lanthanum zirconate titanate. Fatigue in this case is degradation of polarization, lack of which enhances the value of the invented film for ferroelectric random access memory applications. Generally these single phase, low fatigue films enables the fabrication of functional bottom electrodes in a myriad of applications, including capacitor development, battery development, dynamic random access memory development, and electrode development in general.

The structural evolution of the films was determined using differential thermal analysis and X-ray diffraction. Electrical characterization of the fabricated SRO films was conducted on silicon and nickel substrates, and their integrity as a bottom electrode was tested by characterizing the dielectric properties of PLZT films deposited over the SRO bottom electrode. The inventors observed a dielectric response of between about $10^2$ and $10^5$ Hz for PLZT capacitors on SRO-buffered nickel and silicon substrates. The films exhibited relatively flat response of the dielectric constant and loss, indicating the lack of electrode contribution to the dielectric loss, especially at high frequencies.

Precursor Selection Detail

The invented sol-gel process relies on specific alkoxide starting reagents and alcohol solvents. Intermediate compounds which form during the sol gel process prevents formation of $RuO_2$ via individual compound segregation, wherein the cations instead lock up into Sr—O—R gel networks, prior to pyrolysis.

The vetting of precursors and solvents provides a means for modifying the reactants on a molecular level. This molecular level modification enables the production of the target films sans unwanted phases such as certain oxides (e.g. $RuO_2$). The precursors provided the extent of intermixing of metal species, and therefore the formation of gel-networks or individual inorganic phases.

The vetting process enables the reaction kinetics, processing temperatures, crystallization behavior, densification, microstructure or required phase formations to produce conformal coatings discussed supra.

The universe of ruthenium compounds are scrutinized based on several criteria. For example, most of the readily soluble ruthenium compounds contain chloride ions, which deteriorate the electrical properties of the deposited film. It is also evident that, once introduced into the solution, these chloride ions are not completely removed.

Once non-chlorine containing ruthenium compounds are identified, those compounds are subjected to further vetting, this time related to solubility. A myriad of solvents are combined with the non-chlorine containing ruthenium compounds 16 to determine extent of solubility of the ruthenium compounds. The inventors have determined that solvation of at least about 0.3 Molar (and preferably up to 0.5 Molar is suitable. This results in the establishment of a cadre of solvents having the aforementioned suitable solvation abilities.

After solubility is determined, the solvation specific solvents are further scrutinized based on their relative boiling points. Preferably, solvents having boiling points within in about 10 to 20° C. of each other are chosen. The proximity of boiling points enables the homogeneity of the admixtures and minimizes the probability of individual M-O-M forming during pyrolysis instead of the desired lattice structure comprising interconnected M-O-M moieties. (Generally, a different solvent is used for each metal-containing compound to be solubilized. However, it is envisioned that a single solvent can be utilized to solvate both the ruthenium-containing and the strontium-containing compounds.) The formed homogeneous solution at the molecular level decreases the occurrence of phase segregation during spinning, pyrolysis, or crystallization.

Further optimization of solvent choice is consideration of the length of the solvent ligand. In an embodiment of the invented process, lower carbon length ligands (e.g. less than 4 carbons, and preferably between about 2 and 3 carbons in length) facilitates their easy removal during heating. The shorter carbon lengths result in a weaker chelating action. For example, acetic acid is a weaker chelating agent than acetylacetonate. The acetate ligand is easier to remove (organic extraction) during pyrolysis due to its smaller hydrocarbon chain, facilitating M-O-M gel network formation. As a result, strontium acetate remained an excellent precursor in the preparation of BST thin films with acetic acid.

Figure 2:
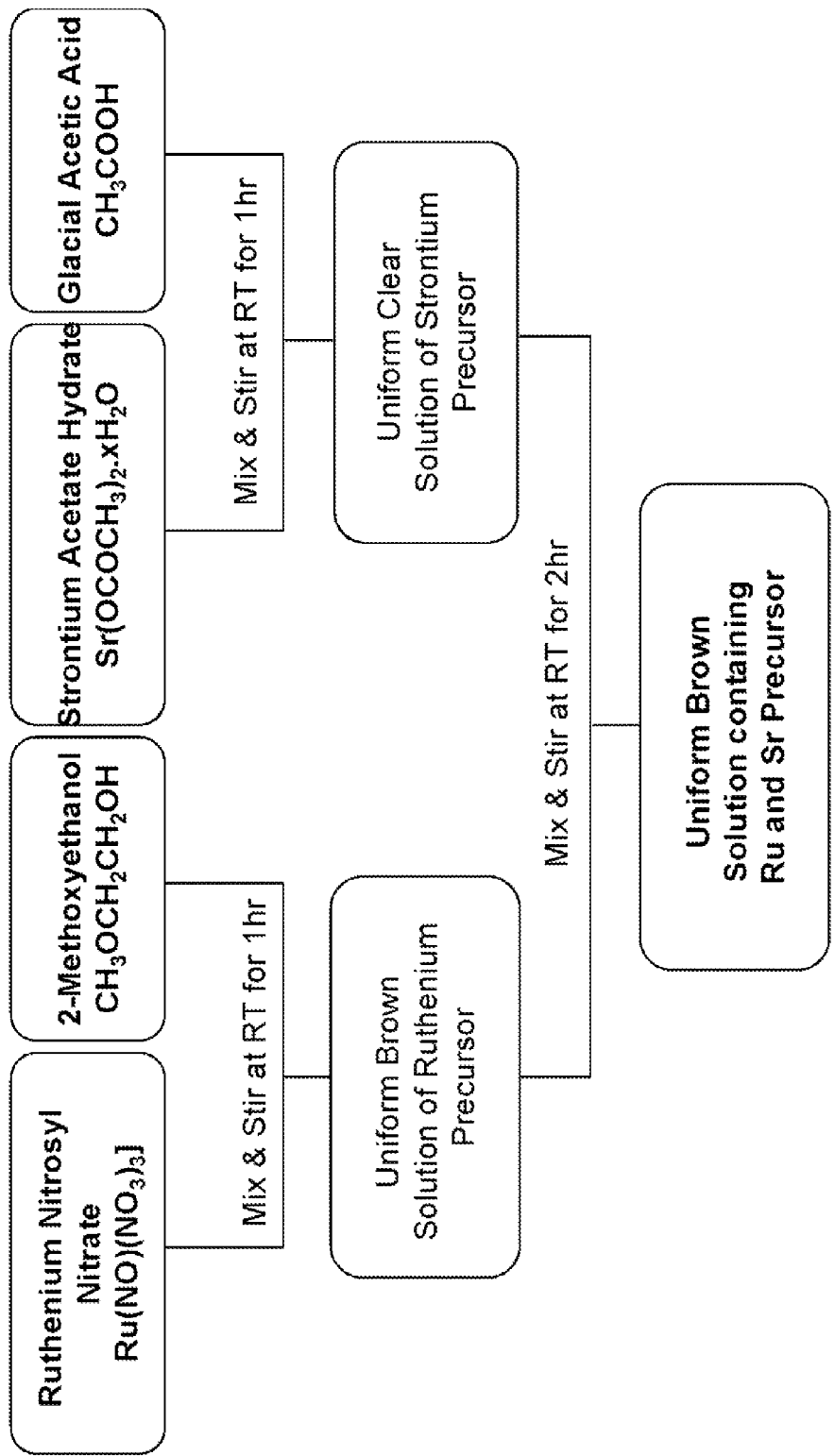
FIG. 2 is a flow chart of an embodiment for creating SRO films using a sol-gel process, in accordance with features of the present invention.

An embodiment of the invented method utilizes non-metallic precursors with short chain ligands and chloride-absent precursors. Ruthenium nitrosyl nitrate and strontium acetate are exemplary ruthenium and strontium compound choices as precursors because of their stability and their complete solubility in 2-methoxyethanol and acetic acid, respectively. This specific solution chemistry and its preparation process is depicted in FIG. 2. FIG. 2 depicts the substantially liquid phase protocol and the relatively benign mixing conditions (i.e., mixing and stirring various solutions at room temperature (RT) for about 1 or 2 hours) to generate the films. A myriad of reaction environments are suitable for the invented protocol, including ambient atmosphere and pressure, or inert atmosphere, such as nitrogen, argon, helium, and combinations thereof.

Although similar diffraction intensities were observed for SRO films made at different crystallization temperatures, scanning electron microscope (SEM) images revealed a marked difference in their surface microstructure. These images, depicted in FIGS. 3A-D, indicate that the films become denser, more homogeneous, and well connected with increasing crystallization temperature. At 600° C. and 650° C. (FIGS. 3A and 3B respectively), the structure of the film is porous as a result of its agglomeration of individual grains such that the grains are not touching each other. This contrasts to the films made above 700° C. (FIG. 3C), where grains appear to be more densely packed and where the grains contact adjacent grains. The aerial density, calculated from these images using ImageJ software, increased from 86.5% to 93.2% when the crystallization temperature increased from 600° C. to 750° C. The average grain size was <100 nm (and preferably between about 60 nm and 90 nm) in diameter. These grain sizes do not vary much with increasing crystallization temperature.

Cross-sectional SEM revealed a thickness of ~0.3 μm for a typical five-layer SRO film on silicon. While a plurality of layers are enabled by the process, a single layer providing the same resistivity values is also capable of being fabricated by the invented sol gel process. Each layer is generated in a two-step heating process with the first step considered a pyrolysis step (whereby solvent and organics are removed from the solvated Ru and Sr mixture) followed by the second heating, i.e., crystallization step.

In operation, these films can be used as electrodes for capacitors and FeRAMs. In an embodiment of an application of the invented film, Pb—La—Zr—Ti (PLZT) films are deposited over SRO coated silicon, and SRO coated nickel substrates. SRO is applied to underlying substrate prior to the deposition of PLZT, using conditions described herein. Platinum top electrodes with different sizes are then deposited over the PLZT film (for example by e-beam evaporation) to measure the dielectric properties of the PLZT film.

SRO acts as a conductive bottom electrode on silicon substrates, while on nickel substrates, SRO films acts as a buffer layer between the nickel and the PLZT to avoid nickel oxidation and nickel diffusion into PLZT. The dielectric properties of the resulting composite confirmed the quality and compatibility of the underlying SRO bottom electrode. SRO can also be used as a top electrode in capacitor/FeRAM applications Capacitor/FeRAM configurations incorporating the invented SRO films include the following:
   Silicon/SRO/PLZT/Platinum, (where SRO is utilized as a conductive oxide bottom electrode);
   Nickel/SRO/PLZT/Platinum. (Nickel forms a oxide layer and also diffuses into PLZT. In this configuration, SRO serves as a buffer layer to stop the aforementioned oxide formation and diffusion.)

The dielectric response between $10^2$ and $10^5$ Hz for PLZT capacitors on SRO-buffered nickel and silicon substrates is represented in FIG. 3. Both films exhibited a relatively flat response of the dielectric constant and loss, indicating the lack of electrode contribution to the dielectric loss, especially at high frequencies. The dielectric constant and loss (tan δ) values within the frequency range are very similar for samples made on both substrates. For example, the dielectric constant and loss at $10^4$ Hz are ~1400 and <0.07 for films on nickel and ~1300 and <0.06 for films made on silicon. The measured dielectric values are comparable to those reported for PLZT on expensive platinum coated silicon Pt—Si (k~1450, tan δ<0.04) and on LaNiO$_3$-buffered nickel (k~1300, tan δ<0.06) substrates processed in air. These results confirm the high quality of PLZT films formed on SRO-buffered nickel and silicon substrates and the structural integrity of SRO as a buffer/electrode layer on nickel and silicon substrates, respectively, for embedded capacitor and memory applications.

A method for making the SRO films includes the following: A 0.2M SRO solution was made by first dissolving stoichiometric ruthenium(III) nitrosyl nitrate [Ru(NO)(NO3)3] (Alfa Aesar, Ward Hill, Mass.) in 2-methoxyethanol [CH3OCH2CH2OH] (2-MOE) (>99.9%, Sigma-Aldrich, St.

Louis, Mo.) and strontium acetate hydrate [Sr(OCOCH3)2.xH2O] (99.995%, Aldrich, St. Louis, Mo.) in glacial acetic acid [CH3COOH] (Fisher Scientific, Fair Lawn, N.J.) at room temperature. These two individual solutions were then mixed together for 2 h at room temperature, forming a uniform brown solution.

The resulting SRO stock solution was used to spin coat onto silicon and nickel substrates through an in-line filter (0.02 μm Whatman filter is suitable). The SRO solution was spin coated onto the substrate (for example at about 3000 rpm for 30 seconds, pyrolyzed at 450° C. for a time sufficient to drive off solvents and organics (e.g. about 10 minutes), and then crystallized at 600-750° C. until a desired density is obtained (e.g., crystallization times of about 5 minutes are suitable). Depending on the thickness of the film desired, this sequence may be repeated several times followed by a final annealing at that temperature. (An exemplary annealing time is about 20 minutes.) The solution was clear and stable without any precipitation for 4-5 days and there was no noticeable solution aging effect on the observed microstructure and electrical properties.

Silicon substrate imposes in-plane tensile stress on the film, the stress due to the thermal expansion mismatch between the film and the substrate. This results in lower XRD peaks.

Differential thermal analysis (DTA) was carried out on constituent precursor solutions and SRO solution by heating them up to 800° C. in air with a heating rate of 10° C./min to develop the mechanistic understanding behind the homogeneous solution formation. The phase development of the films was studied with a Bruker AXS D8 diffraction system. Microstructure and thickness were characterized with a Hitachi S-4700-II field-emission scanning electron microscope (SEM). Platinum top electrodes (250-μm diameter and 100-nm thickness) were then deposited by electron beam evaporation through a shadow mask. Resistivity was measured by the four point probe method using a Keithley 237 current source meter and Keithley 6517 electrometer. Optimized crystallization conditions, which resulted in the lowest-resistivity SRO films on silicon substrates, were used in subsequent experiments.

Optimized SRO films were deposited on silicon substrates and nickel followed by the deposition of PLZT dielectric films. A stock solution of about 0.5 M $Pb_{0.92}$ $La_{0.08}$ $Zr_{0.52}$ $Ti_{0.48}$ $O_3$ (PLZT 8/52/48) was prepared by modified sol-gel synthesis using 2-methoxyethanol as the solvent. Details on the solution synthesis and thin film deposition of PLZT are reported in Ma, et al *J. Electroceram* 2009, 22, 383 and incorporated herein by reference.

After platinum top electrodes were deposited, dielectric measurements were made with standard equipment. Exemplary such equipment includes an Agilent E4980A LCR meter using an oscillator level of 0.1 V at 10 kHz in conjunction with a SignatoneQuieTemp probe station (Lucas Signatone Corp., Gilroy, Calif.). A Keithley 237 high-voltage source meter and Radiant Technologies Precision Premier II tester is suitable to measure the leakage current and polarization field (P-E) hysteresis loops. Polarization fatigue measurements were carried out using a 130 kV/cm and 50 kHz square waveform for $>1 \times 10^9$ cycles. Data were collected automatically by programming the Vision software in the Premier II tester. All dielectric measurements were made with a top-electrode to top-electrode (two similar capacitors in series) configuration.

The above description of film fabrication is also disclosed in Narayanan et al, *Chem Mat.* 2011, 23, 106-113, the entirety of which is incorporated herein by reference.

Generally, the invention provides for a method for producing pure phase strontium ruthenium oxide films. The method comprises forming a gel of reagents which prevent the formation of unwanted phases during pyrolysis and crystallization of the gel. Simultaneously, the invented chemistry induces alignment of the cations of the defining the film with the lattice structure of substrate supporting the film. This alignment results in an ordered lattice structure of the film and therefore the superior resistivity values discussed herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

The present methods can involve any or all of the steps or conditions discussed above in various combinations, as desired. Accordingly, it will be readily apparent to the skilled artisan that in some of the disclosed methods certain steps can be deleted or additional steps performed without affecting the viability of the methods.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

The invention claimed is:

1. A method for producing pure phase strontium ruthenium oxide films, the method comprising:
   a. solubilizing a non-chlorinated ruthenium-containing compound with a first solvent to form a first solution and a non-chlorinated strontium-containing compound with a second solvent to form a second solution, wherein the first and second solvents are different, and wherein the first and second solvents form ligands less than 4 carbons in length;
   b. combining the first solution and second solution into a single mixture;
   c. subjecting the mixture to a first temperature above that necessary for forming strontium ruthenium oxide while simultaneously preventing formation of $RuO_2$;
   d. maintaining the first temperature for a time to remove organic compounds from the mixture, thereby forming a substantially dry film; and
   e. subjecting the film to a second temperature higher than the first temperature for time sufficient to crystallize the pure strontium ruthenium oxide film in the perovskite crystal structure.

2. The method as recited in claim 1 wherein the mixture is deposited on a substrate prior to subjecting the mixture to a first temperature.

3. The method as recited in claim 2 wherein substantially all of the ruthenium cations in the ruthenium containing compound comprise a cation lattice and the lattice is arranged in a polycrystalline structure that is aligned with the lattice structure of the substrate.

4. The method as recited in claim 1, wherein the first and second solvents form ligands and are less than 3 carbons in length and wherein the first and second solvents have boiling points within about 10-20° C. of each other.

5. The method as recited in claim 4 wherein the first and second solvent are organic compounds selected from the group consisting of 2-methoxyethanol, acetic acid, and combinations thereof.

6. The method as recited in claim 1 wherein a subsequent film is formed over the film by repeating steps a through e.

7. The method as recited in claim 1 wherein the first temperature is selected from between about 250° C. and 500° C.

8. The method as recited in claim 1 wherein the second temperature is selected from between about 500° C. and 800° C.

9. The method as recited in claim 1 wherein the ruthenium-containing compound is from the group consisting of ruthenium nitrosyl nitrate, ruthenium acetylacetonate, ruthenium nitrosylacetate, ruthenium bromide, and combinations thereof.

10. The method as recited in claim 1 wherein the strontium-containing compound is selected from the group consisting of strontium acetate hydrate, strontium acetylacetonate, strontium oxalate, and combinations thereof.

11. The method as recited in claim 1 wherein substantially all of the ruthenium cations in the ruthenium containing compound comprise a cation lattice.

12. The method as recited in claim 1 wherein the first and second solvents have boiling points within about 10-20° C. of each other.

* * * * *